United States Patent

Kodama et al.

[11] Patent Number: 5,878,942
[45] Date of Patent: Mar. 9, 1999

[54] SOLDERING METHOD AND SOLDERING APPARATUS

[75] Inventors: Yasushi Kodama, Ohmihachiman; Shuhei Tsuchita, Kusatsu; Yutaka Tsukada, Kohga-gun; Yasumitsu Orii, Kanzaki-gun; Hideo Ohkuma, Yasu-gun, all of Japan

[73] Assignee: International Business Machines Corporation, Armonk, N.Y.

[21] Appl. No.: 712,541

[22] Filed: Sep. 11, 1996

[30] Foreign Application Priority Data

Sep. 22, 1995 [JP] Japan .................................... 7-244246

[51] Int. Cl.$^6$ ............................ B23K 31/02; B23K 37/04
[52] U.S. Cl. .................................. 228/180.22; 228/44.7; 228/49.5
[58] Field of Search ............................. 228/180.22, 6.2, 228/44.7, 49.5

[56] References Cited

U.S. PATENT DOCUMENTS

| 4,693,770 | 9/1987 | Hatada | 228/180.22 |
| 4,808,769 | 2/1989 | Nakano et al. | 228/180.22 |
| 5,551,627 | 9/1996 | Leicht et al. | 228/180.22 |
| 5,611,481 | 3/1997 | Akamatsu et al. | 228/180.22 |
| 5,739,053 | 4/1998 | Kawakita et al. | 228/180.22 |

FOREIGN PATENT DOCUMENTS

| 62-97342 | 3/1987 | Japan | 228/180.22 |

Primary Examiner—Patrick Ryan
Assistant Examiner—Jeffrey T. Knapp
Attorney, Agent, or Firm—Tiffany L. Townsend

[57] ABSTRACT

Methods and apparatuses to perform soldering while the chip is held by a head under melted solder condition are disclosed. Solder bumps 3 are formed on the chip 1, and they are opposite to terminals 11 on a mounting board 10. Furthermore, a heating block 21 is located at the back of the chip, and it raises the temperature of the solder bumps 3 on the chip 1 to a melting point by heating the chip back by conduction. Preferably, another heating block 22 is located at the back of the mounting board 10. Soldering is performed by bringing the solder bumps 3 into contact with the terminals 11 while the solder is melted.

13 Claims, 6 Drawing Sheets

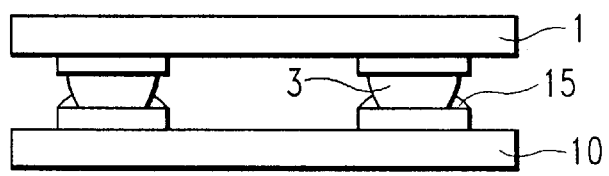
(PRIOR ART)
FIG. 5
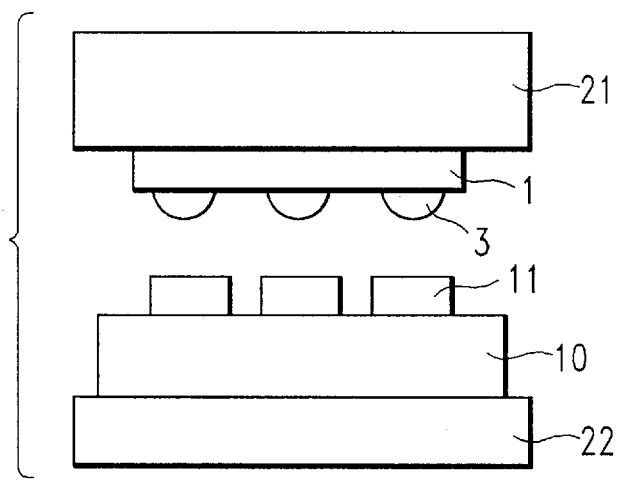
FIG. 6
FIG. 7
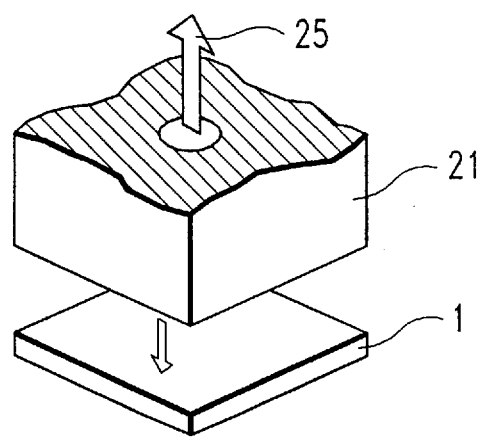

PRESSURE IN MOUNTING

SOLDERING METHOD AND SOLDERING APPARATUS

FIELD OF THE INVENTION

This invention relates to a soldering method for attaching semiconductor chips to a mounting board. More particularly, the invention relates to an improved method for soldering semiconductor chips onto the board while performing flip-chip mounting, and the like.

BACKGROUND ART

As a method for electrically connecting semiconductor chips to a mounting board, the chips are conventionally connected to bonding pads on the board using bonding wire (the wire-bonding method). This method is effective for connecting the terminals located around the chip edge to the board. Recent developments in LSI logic, such as gate array or microcomputer logic, have led to increased chip density and improved function and led to an increased number of terminals per board. As a result, it is necessary that input-output terminals be located at the center of the chip surface. The conventional wire-bonding method for electrically connecting semiconductor chips to a mounting board cannot be adopted.

Alternately, another method (so-called the flip-chip method) is noted, wherein semiconductor chips are connected to a mounting board through bump terminals, which are solder bumps formed on the chips. In this method, the bumps on a chip are connected to the board on the back of a chip. This method allows for increased chip density since it is possible to form the terminals not only on the periphery of the chips, but also on the inner surface.

The bonding process with the flip-chip method is shown in FIGS. 1 through 5. At first (FIG. 1), the solder bumps 3 are formed on the terminals 2 of a semiconductor chip 1. The methods for forming solder bumps include solder vapor deposition, solder plating, and paste printing. In addition to the flip-chip method, the BGA (Ball Grid Array) method is available as a similar bonding method. BGAs are usually formed using either the solder ball supplying method or solder paste printing method. In either method, the bonding surface 4 of the solder bump 3 is then flattened as required. Then, the solder bumps 3 formed on the chip 1 are aligned with terminals 11 on the mounting board 10, as shown in FIG. 2. Flux 12 is then applied on the surface of terminals 11 on the mounting board 10, as shown in FIG. 3. One of functions of flux 12 is to temporarily fix the chip with its high viscosity. Flux 12 may also be applied to the solder bumps 3. As shown in FIG. 4, the solder bumps 3 come in contact with the terminals 11 on the mounting board 10 through the flux 12. The arrangement is fixed to prevent movement and the temperature is slowly raised to reflow the solder. It is important that the temperature be raised slowly; if heated rapidly, the chip might move and misalignment might occur before solder melting due to flux vaporization during the heating. After reflowing the solder, the terminals 2 on the semiconductor 1 are electrically connected to the terminals 11 on the mounting board 10 via the solder 3, as shown in FIG. 5. Upon cooling, the flux shrinks and adheres to the solder, shown in 15 in FIG. 5. Preferably, the flux will be removed during the subsequent cleaning process.

A common method for solder reflowing is to put the object in a hot-air furnace or in an infrared heating reflow furnace. In contrast, as disclosed in the Japanese Published Patent Application 6-124980, for example, another method has been proposed to provide an air-heating mechanism on a nozzle that grasps the chip at the time of its alignment and melts the solder with hot air.

In this process, since the forming method of the solder bumps 3 has an effect on the process cost, a low-cost method should be adopted. Conventionally, the solder vapor deposition and the solder plating method have been adopted as the technique for forming bumps for high-density patterns on a ceramic substrate, but the facility cost is high and productivity is not sufficient when using these methods. Consequently, the screen printing method is recommended as a low-cost method. In this method, a mask that only has holes for solder paste at solder bump locations is set on the chip. The solder paste is applied by squeezing the solder paste through the holes of the mask. The bumps are thus formed by transferring bulks of solder paste only at the required positions on the chip. Frequently the height of the solder deviates in this kind of low-cost method, and a flattening of the contact surface of the solder bumps is required (see FIG. 1).

Further, in these methods, pressure should be applied to solder the chips to a mounting board. When 324 bumps are formed on the present chip product, for example, approximately 650 gf pressure should be required, assuming that 2 gf is required per bump. In the future, as the number of bumps approaches to 2000, it is anticipated that the required pressure will be as large as approximately 4 Kgf. But applying such a large pressure on the chip might cause harmful influences on the chip function or on other aspects. Optimization of the process parameters to prevent the anticipated harmful influences is very complicated.

In summary, the prior art identifies the following items as problems in forming solder bumps and mounting chips:
  (1) Flattening the bumps is necessary to eliminate solder height variation.
  (2) Appropriate pressure is required for mounting chips.

To solve these problems, a method is proposed in the Japanese Published Patent Application 4-83353, wherein both the chip and the mounting board are preheated during a prior contact between the terminals on the chip and those on the mounting board. Then the soldering is performed by continuously heating the back of the chip with radiant heat. A certain distance is maintained between the heating block and the back of the chip. This method can heat solder bumps equally by preheating the mounting board, and it does not squeeze the solder bumps because of a weakly applied pressure during the solder melting. However, there is a possibility of misalignment of the chip due to vaporization of the flux-volatile ingredients, since the chip is not held by the heating block during the solder melting.

In view of productivity, it is desirable to eliminate the step of flattening the solder bumps. The solder bumps must be in contact with the terminals of the mounting board during solder melting, not when the solder is solid. If the solder bumps on the chip contact the terminals on the mounting board when the solder is melted, pressure is not required during the chip mounting. Further a method must be provided to prevent misalignment because of vaporization of flux-volatile ingredients during the solder melting.

The problems that should be solved by this invention are:
  (1) to provide a method wherein the solder bumps on the chip are contacted to the terminals on the mounting board via molten solder; and
  (2) to provide a method wherein no misalignment occurs during the soldering.

BRIEF SUMMARY OF THE INVENTION

The foregoing problems for this patent may be solved by heating and melting the solder bumps on the chip with a heating block contacting the chip, and then by bringing the molten solder into contact with the terminals on the mounting board. This method requires neither flattening the solder bumps substantially nor applying pressure in chip mounting, because the solder is molten. Additionally, no misalignment occurs, because the chip is held by the heating block.

The foregoing problems for this patent may also be solved by melting the solder formed on the terminals on the mounting board by radiant heat from the heating block contacting the chip, and then by bringing the chip bumps into contact with the solder layer on the terminals of the mounting board. This embodiment is especially effective when the bumps formed on the chip are composed of metal (for example, copper or gold) other than the solder, or when the bumps are composed of solder with a high-temperature melting point and the mounting board is a printed circuit board. In this embodiment also, neither flattening of the bumps formed on the chip or on the board, nor applying pressure is required because the solder is molten. Additionally, no misalignment occurs because the chip is held by the heating block.

As described above, features of the present invention are summarized in the following two points: (1) to melt the solder layer formed on the terminals on the chip or the mounting board by utilizing conduction heat, or a combination of conduction heat and radiant heat, from the heating block as a heat source; and (2) to solder chips by contacting objects via molten solder layer as well as holding the chips with the heating block. Details with some example embodiments are described below.

BRIEF DESCRIPTION OF THE DRAWINGS

FIG. 5 is a drawing to illustrate a soldering process of the conventional flip-chip method;

FIG. 6 is a drawing to show a soldering method of the first embodiment of the present invention;

FIG. 7 is a drawing to illustrate a soldering process of the first embodiment of the present invention;

DETAILED DESCRIPTION OF THE INVENTION

Figure 1:
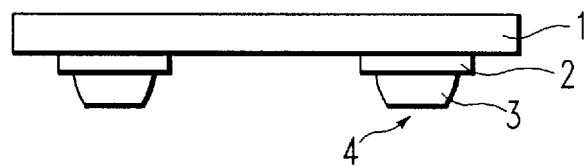
FIG. 1 is a drawing to illustrate a soldering process of the conventional flip-chip method.
Figure 2:
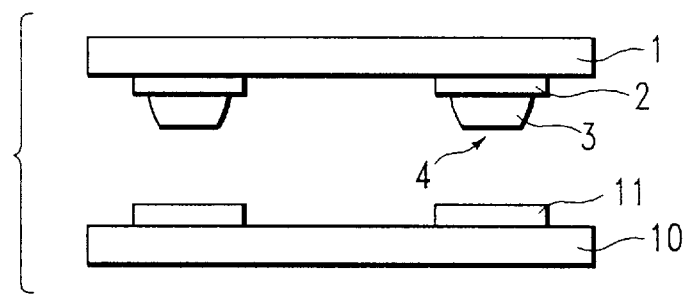
FIG. 2 is a drawing to illustrate a soldering process of the conventional flip-chip method.
Figure 3:
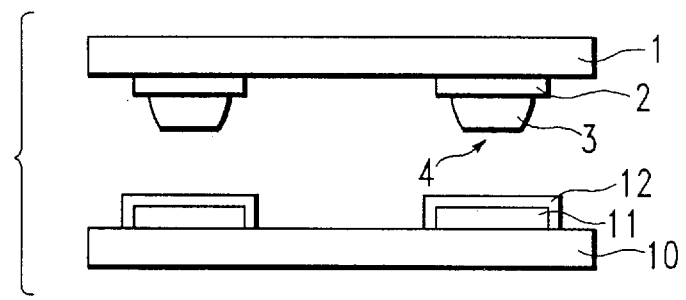
FIG. 3 is a drawing to illustrate a soldering process of the conventional flip-chip method.
Figure 4:
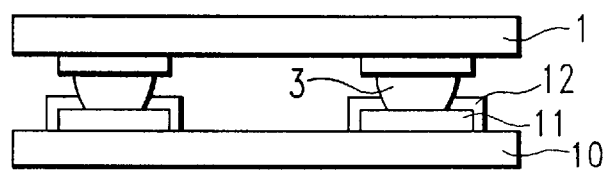
FIG. 4 is a drawing to illustrate a soldering process of the conventional flip-chip method.

The present invention has been disclosed using two embodied examples, and the features of the present invention are summarized to two points as follows: (1) to melt the solder layer formed on the terminals of the chip or the mounting board using conduction heat, or a combination of conduction heat and radiant heat, from a heating block heat source; and (2) to perform soldering by contacting objects via a molten solder layer, while holding the chip to the heating block.

The merit of performing soldering with a melted solder layer as described in (1) is that mounting pressure is not required. Further, the process does not require prior flattening of the height of the solder bumps because the solder has been melted. This is an especially significant advantage in view of production cost, because a low-cost screen printing method (which cannot make the bump height flat) can be used to form the solder bumps.

Chip misalignment due to vaporization of flux-volatile ingredients can be prevented, because the soldering is performed while the chip is held by the heating block, as described in (2).

Operation can be easily controlled. For example, the solder bonding part can be made into a waist shape by freely adjusting the distance between the chip and the terminals after soldering.

The first embodiment is shown in FIG. 6. The parts in common with the parts shown in FIG. 1 through FIG. 5 are indicated with the same number. That is, the solder bumps 3 are formed on the chip 1 (the terminals on the chip are not shown), and they are facing opposite to the terminals 11 on the mounting board 10 (the flux is not shown). Additionally, a heating block 21 is located at the back of the chip; heating the back surface of the chip 1 thereby raising the temperature of the solder bumps 3 by heat conduction to the melting point of the solder. Preferably, another heating block 22 is located at the back surface of the mounting board 10. This can prevent unnecessary internal stress in the molten solder due to rapid cooling at the moment when the molten solder bumps 3 are soldered to the terminals 11 on the mounting board 10, which will be an additional advantage in operation efficiency. Solder materials that melt at low temperature are desirable ; for example, an eutectic solder (63 Sn/37 Pb) is used.

In this case, the flux is typically applied on the solder bumps 3 of the chip 1 side. Further, a self-alignment effect might be expected if flux is also applied on the mounting board 10. It is desirable to perform soldering in an inert environment, such as in nitrogen gas, to assure covering by the melted solder. Further, for heating the solder bumps, infrared heating and a hot-gas heating method may be used together with the conduction heat from heating block 21. This method prevents the chips from being misaligned under the influence of solder surface tension because the solder has already been melted, even if the flux amount varies to some extent and the vaporization amount of solvent is unstable.

Figure 8:
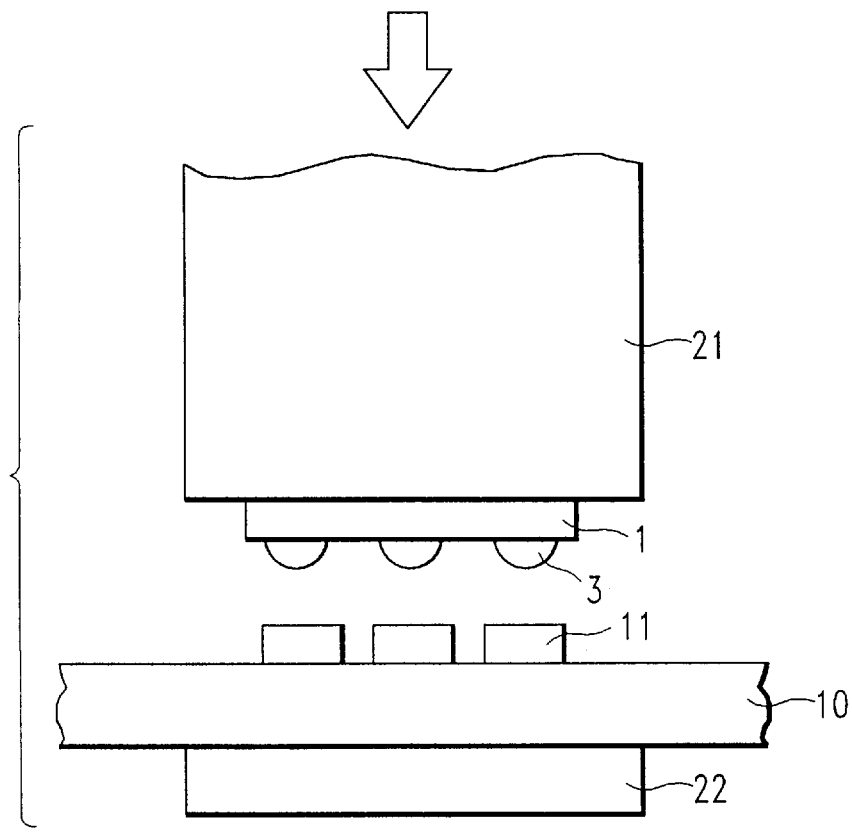
FIG. 8 is a drawing to illustrate a soldering process of the first embodiment of the present invention.
Figure 9:
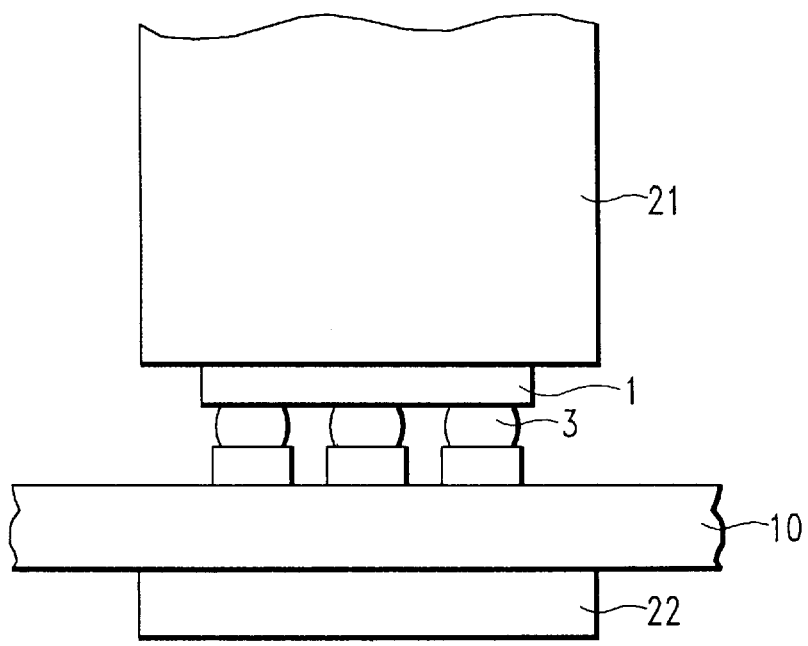
FIG. 9 is a drawing to illustrate a soldering process of the first embodiment of the present invention.
Figure 10:
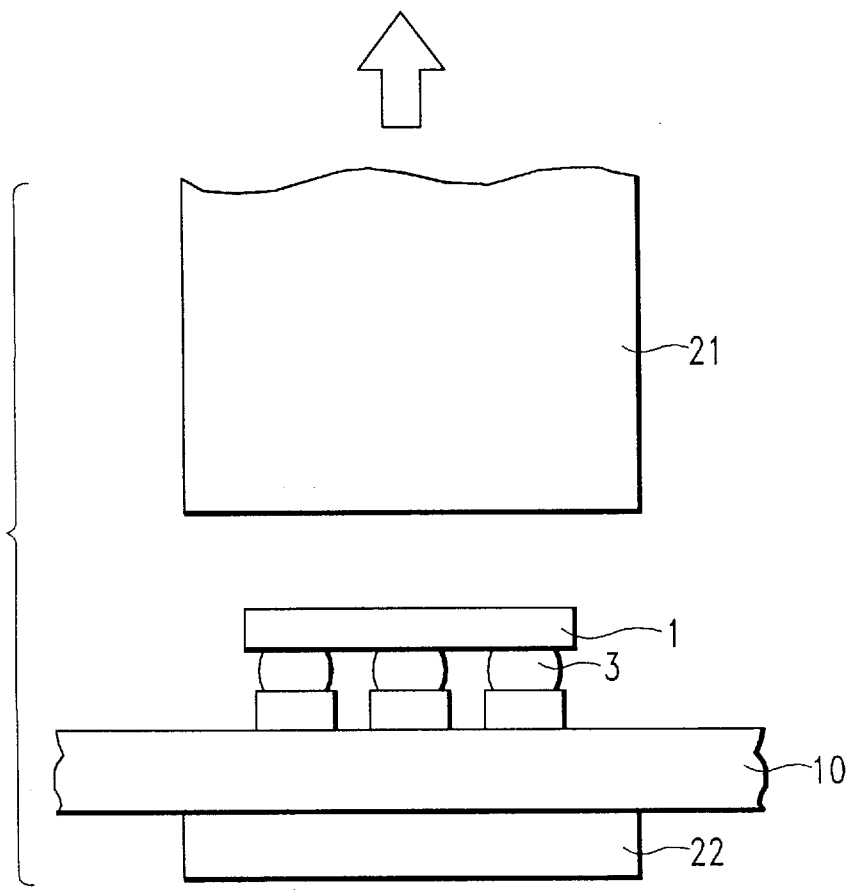
FIG. 10 is a drawing to illustrate a soldering process of the first embodiment of the present invention.

A concrete process is described below and in FIG. 7 through FIG. 10. As shown in FIG. 7, the heating block 21 comprises a vacuum head, and it adsorbs and holds the chip 1 by its back by adsorbing air through a hole 25. A moving mechanism is connected to the top of the heating block 21 and controls the placement of the block, though it is not shown in the figure. Any method may be used for the connection between the moving mechanism and the heating block 21, and for the location control method by that mechanism. The moving mechanism may have the function of air adsorbing. As shown in FIG. 8, the terminals 11 on the mounting board 10 located on the heating block 22 are aligned with the solder bumps 3 on the chip 1. Then a heat source (not shown in the figure) of the heating block 21 is powered on, and the solder bumps 3 are heated by conduction. After the solder bumps 3 have melted, they are brought into contact with the terminals 11 on the mounting board 10 as shown in FIG. 9, and soldering is done. Since the chip 1 is held by the heating block 21, misalignment due to vaporization of flux-volatile ingredients in soldering does not occur. After the solder bumps 3 are contacted with the terminals 11, the heat source of the heating block 21 and 22 is powered off. The air adsorption is stopped after the solder bumps 3 become fully hard, as shown in FIG. 10, and the heating block 21 is separated from the chip.

This embodiment has the following two features of the present invention as described above: (1) to melt the solder layer formed on the chip using conduction heat from a heating block as a heat source, and (2) to perform soldering by contacting objects via molten solder layer as well as holding the chip by the heating block.

Figure 11:
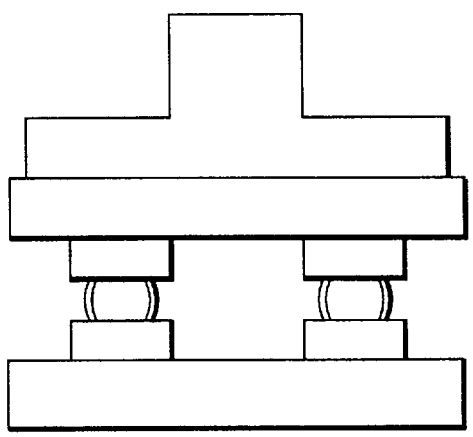
FIG. 11 is a drawing to show a process to control the soldering shape of the present invention.

Further, using this patent, it is possible to control the shape of solder bump after the soldering. For example, when the chip 1 and the heating block 21 are pulled up together without powering off the heat source of heating block 21 and 22 after contacting the melting solder bumps with the terminals 11, as shown in FIG. 11, the solder bump shape can be changed to a vertically long one(a waist shape). When it is formed into such a waist shape as this, the thermal fatigue characteristic of solder bonding part can be improved. A method described in the Japanese Published Patent Application 64-25548, for example, has been introduced, but the present invention differs from this method by forming a waist shape under the condition of melted solder.

Figure 12:
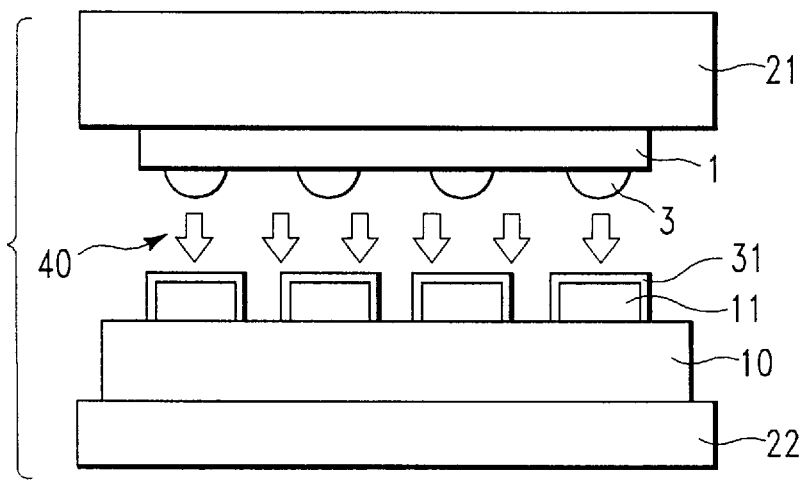
FIG. 12 is a drawing to show a soldering process of the second embodiment of the present invention.

The second embodiment is shown in FIG. 12. In this embodiment a new method is considered, wherein the bumps 3 formed on the chip 1 are metals such as gold or copper, which have a comparatively higher melting point than solder, or solder with a higher melting point. These bumps are not melted, but the solder layers 31 on the carrier side are melted in soldering. As shown in FIG. 12, all other elements are the same as the ones in the first embodiment in FIG. 6. A heating block 21 is located at the back of the chip 1 for heating, and another heating block 22 is located in like manner at the back surface of the mounting board 10. The terminals 11 are on the mounting board 10, and the solder layers 31 formed on the terminals are opposite to the bumps 3 on the chip 1. When the heat source of the heating block 21 is powered on, heat is transferred from the heating block 21 to the bumps 3 via chip 1 by conduction, and heat is transferred between the bumps 3 and the solder layers 31 by radiant heat. The radiant heat 40 melts the solder layers 31 formed on the terminals 11 on the mounting board 10. After the solder layers 31 are melted, soldering is performed by bringing the bumps 3 into contact with the solder layers 31 by lowering the chip 1.

This method also has the following two features of the present invention: (1) to melt solder layers on the terminals of the mounting board using both conduction heat and radiant heat from a heating block as a heat source, and (2) to perform soldering by contacting objects via molten solder layer as well as holding the chip by the heating block.

EMBODIMENT EXAMPLE

Table 1 summarizes a mounting method of the flip-chip method currently used in the industry.

TABLE 1

| Type | Bumps on Chip | Bumps on Mount Board | Board Type |
|---|---|---|---|
| A | High-melt-point solder (Melted in mounting) | — | Ceramic |
| B | High-melt-point solder (Not melting) | Eutectic solder (Melting) | Printed cct |
| C | Gold bump (Not melting) | Indium family solder (Melting) | Printed cct |

Figure 13:
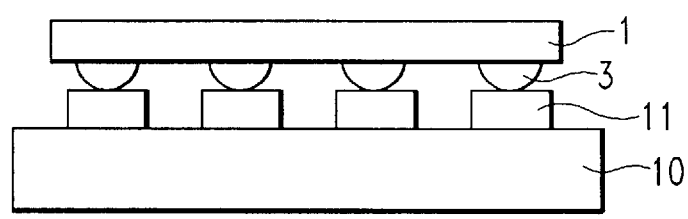
FIG. 13 is a drawing to illustrate a soldering mode of the flip-chip method of the conventional technology.

Type A is like the one shown in FIG. 13. The mounting board 10 is a ceramic board. Other elements are the same as those used in the previous figures, and bumps 3 are formed on the chip 1 with high-melting-point solder and are connected with the terminals 11 on the board 10. In the conventional flip-chip method, the solder bumps on the chip must be melted during the mounting of the chip, so the height of the bumps must previously be made flat to some extent. Additionally, since the bumps 3 must be in contact with the terminals 11 before heat is applied, a large pressure must be applied in mounting chips. It is apparent from the foregoing description that a larger tolerance is acceptable for the bump height, and that pressure is almost unnecessary, when the present invention is used. The preferred composition of the high-melting-point solder is 10Sn/90Pb and the like.

Figure 14:
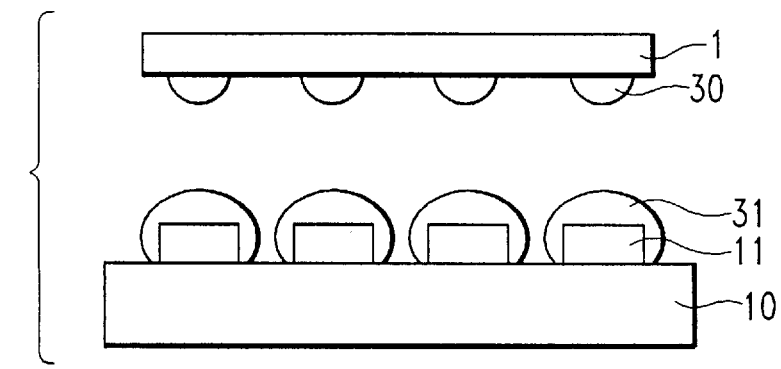
FIG. 14 is a drawing to illustrate a soldering mode of the flip-chip method of the conventional technology.
Figure 15:
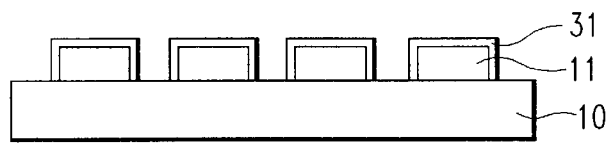
FIG. 15 is a drawing to show a soldering process of the second embodiment of the present invention.
Figure 16:
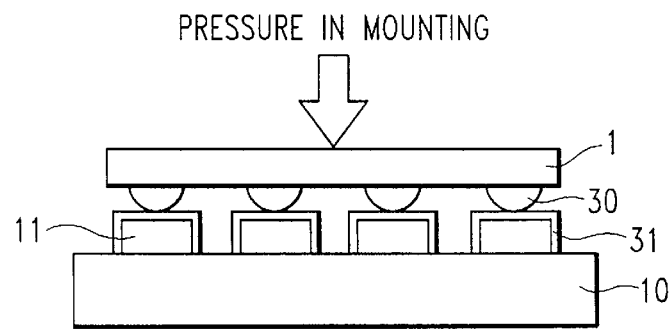
FIG. 16 is a drawing to illustrate a soldering mode of the flip-chip method of the conventional technology.

Type B in Table 1 is the one shown in FIGS. 14, 15, and 16. In this method, the solder bumps 30 with a high melting point are formed on the chip 1, and the mounting board is a printed circuit board on which the terminals 11 and the eutectic solder layers 31 are formed, as shown in FIG. 14. The eutectic solder layers 31 are connected by solder reflow-in-whole in the current flip-chip mounting, and thus strict control of the solder bump amount and flattening of the solder height are required to prevent chip misalignment and bonding failure. The shape of the eutectic solder layers 31 after flattening is shown in FIG. 15. That is, the eutectic solder layers 31 on the terminals 11 are flattened. Then flux is applied to cover the whole high-melting-point solder bumps 30 mounted on the chip 1 (not shown in the figure), and solder reflow is performed in whole with pressure, as shown in FIG. 16.

For this method also, the present invention has the merits that previous flattening of the eutectic solder layers 31 is not required, and that pressure is not required in solder reflow. This is because the eutectic solder layers 31 formed on the terminals are melted by radiant heat 40 from the high-melting-point solder bumps 3, as shown in FIG. 12. In FIGS. 5, 12, and 15, the eutectic solder layers 31 are flattened, but this is not necessarily required.

Type C in Table 1 is similar to type B, but the following points are different: (1) the bumps 3 on the chip 1 are gold and not high-melting-point solder, and (2) the bumps on the board are solder containing indium. Solder containing indium has greater hardness when compared to eutectic solder, and it is well suited for use with the gold of the solder bump material on the chip. The adoption of the present invention has the significant advantages in that both the flattening of the solder bumps with indium content and the application of pressure when reflowing the solder are not required.

Further, the present invention can be applied not only to the semiconductor chip but also to a BGA (Ball Grid Array) module as a mounted device. A typical mounting method of the flip-chip for the BGA module is shown in Table 2.

TABLE 2

| Type | Bumps on BGA Module | Bumps on Mounting Board |
| --- | --- | --- |
| A | Eutectic solder (Melting) | — |
| B | High-melting-point solder (No melting) | Eutectic solder |

Type A is used for a plastic BGA and a tape BGA, for example. During the reflowing process, the solder on the BGA module is melted. Type B is used for a ceramic BGA and a tape BGA, for example. A high-melting-point solder is used on the BGA module in contrast to the type A solder, and it is not melted during the reflowing process. In type B, ceramic is used for the module, so the difference in thermal expansion coefficients between the module and the mounting board (printed circuit board) is very large, and the distance between the module and mounting board should be expanded to absorb this difference. Therefore, the distance is maintained using the high-melting-point solder bumps on the BGA module, which are not melted during the reflow process.

But even for type B, the eutectic solder can be used on the module if the present invention is adopted. The solder bumps can be formed to a waist shape in their vertical cross-sectional view (see FIG. 11) by pulling up the heating block while the bumps on the BGA module are in contact with the melted bumps on the mounting board.

As just described, many advantages will possibly be provided by replacing the solder reflow-in-whole and like methods used in the conventional flip-chip method with the present invention.

Since the present invention is a replacement method for the conventional solder reflow-in-whole method, its compatibility with the solder reflow cooling process is important. The object is not cooled rapidly in the solder reflow-in-whole method, in which the object is put in the furnace and the reflow is performed in a batch. This is an advantage of the solder reflow-in-whole method. If rapid cooling is done after the reflow, a breakage might occur due to induced thermal stress by the difference of the thermal expansion coefficients between the mounting board (made of resin) and the semiconductor chip (Si substrate). In the present invention method, the rapid cooling might possibly be done by separating the heating block, so a further consideration is required for it.

Figure 17:
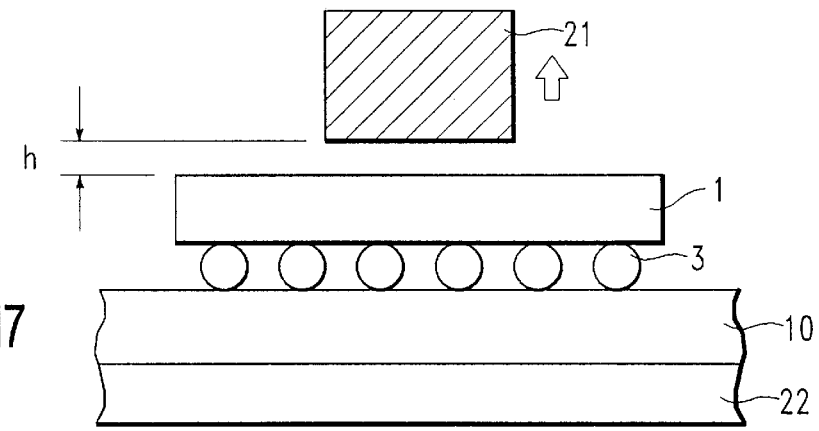
FIG. 17 is a drawing to show one embodiment of the apparatus to implement the present invention.

To avoid rapid cooling after the reflow in the present invention process, a method can be adopted to maintain the specified chip temperature using radiant heat from the heating block on the back surface of the chip by keeping the heating block slightly apart from the back surface for a certain period. As shown in FIG. 17, this method prevents excessive thermal stress by slowly cooling the chip. The chip is slowly cooled by gradually increasing the distance h between the chip 1 and the heating block 21. Such a movement of the heating block could be performed using a known method to control the moving mechanism (not shown), connected to the heating block.

Table 3 shows a correlation between the distance h of the chip 1 back to the heating block 21 and the temperature at the solder joint part 15. Another heating block 22, which maintains a temperature of 110 Deg C. is located at the back of the mounting board 10 in contact with the board during this measurement. The heating block 21 stays at approximately 200 Deg C. while it is in contact with the back of the chip 1 and is used for the solder reflow. The chip has a 9-mm-square size, and heating block 21 is gradually pulled up from its contact position with the chip 1 back. The heating block is temporarily held at a predetermined distance h, and at each position the balanced temperature on the joint part 15 is measured using a thermo-couple.

TABLE 3

| Distance h (micron) | Balanced Temperature (Deg C) |
| --- | --- |
| 0 | 159 |
| 40 | 151 |
| 50 | 147 |
| 70 | 141 |
| 120 | 134 |
| 140 | 132 |
| 170 | 131 |
| 190 | 130 (Solder melting point) |
| 290 | 127 |
| 390 | 125 |
| 490 | 124 |
| 910 | 121 |
| 1910 | 118 |
| 2910 | 115 |
| 5000 | 115 |

The moving speed of the heat source block must be controlled to be less than 2 mm per minute at maximum It should also be remembered that damage, such as a crack, might occur at the connection part due to the thermal expansion difference when the speed of cooling surrounding the solder connection area is greater than 1 Deg C. per second.

Figure 18:
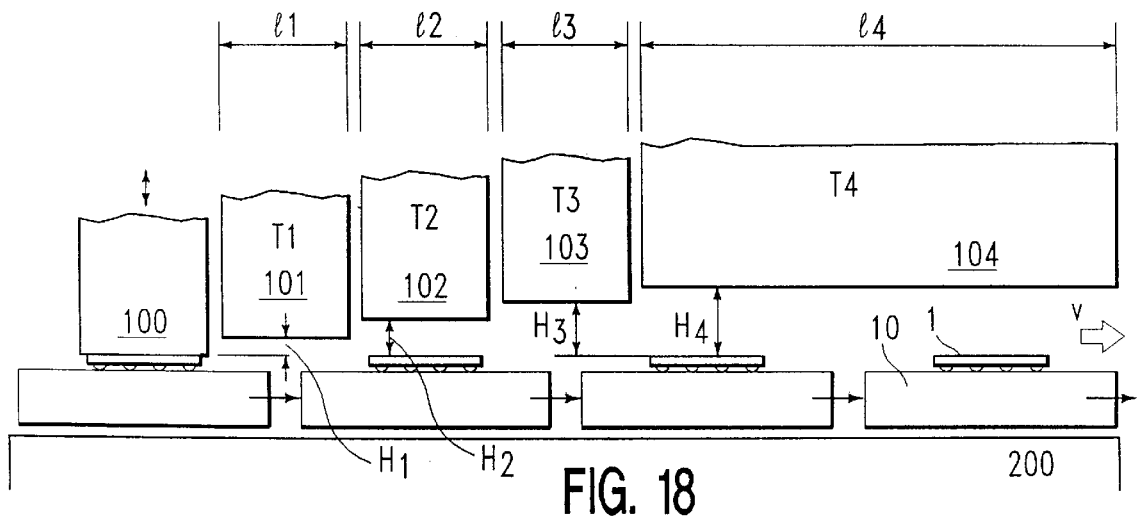
FIG. 18 is a drawing to show another embodiment of the apparatus to implement the present invention.

The preceding example describes a batch-type control method, but a line-type one should be adopted when production volume is high. An example of that case is shown in FIG. 18. The heat source blocks are indicated as 100, 101, 102, 103, and 104, and they are apart from the chip 1 back at the specified distances, respectively. The chip 1 on the mounting board 10 is bonded to the board by solder reflow under the first heating block 100. Then the mounted device is carried with a speed V on a conveyor (not shown) being set up on a heater 200. According to FIG. 18, the temperature,T, the distance between the heating source and the chip back, h, and the length of time at each heating block,l, need to be correlated to achieve adequate cooling conditions. The heat from the heating blocks reaches the chip back by radiation, and keeps the connection part at the required temperature to achieve the cooling conditions. A solder reflow method utilizing the present invention may be adopted on a mass-production line.

A technical concept that underlies the present invention is summarized as follows:

(1) Low melting point solder bumps, formed on the chip, are melted by conduction heat from a heating block located on the back surface of the chip. The solder bumps are soldered to the opposite terminals under their melting condition (Embodiment 1).

(2) Heat is transferred to the high-melting-point solder bumps formed on the chip through the back surface of the chip using conduction heat. The heat is transferred from the bumps to the opposite terminal by radiation and the low melting point solder on the terminals is melted. Soldering is accomplished by contacting the solder layer with the bumps under melting conditions (Embodiment 2).

Further, the technical concept of the present invention can also be applied to BGA in the same way, though the flip-chip method with solder bumps is described as an embodied example.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the claims.

What is claimed is:

1. A soldering apparatus for soldering a first conductive part formed on a first object to a second conductive part formed on a second object comprising:

(a) a carrying means for carrying said second object in a first direction;

(b) a heat source means at a first location in contact with said first object for melting at least a portion of at least one of a first conductive part and a second conductive part by at least conduction heat so as to form a molten layer, said molten layer physically connecting said first conductive part with said second conductive part, and said heat source means stabilizing said first object during soldering;

(c) a moving means for moving said heat source means in a second direction perpendicular to said first direction after said molten layer is formed, and d) at least one second heat source means at a second location for transferring heat by radiation to the back surface of said first object after soldering to said second object, such that a predetermined distance and temperature exist between said second heat source means and the back surface of said first object as it is carried by said carrying means.

2. A method for soldering a first conductive part formed on a first object to a second conductive part formed on a second object, the method comprising the steps of:

melting at least a portion of at least one of the surfaces of said first conductive part and said second conductive part by utilizing heat conduction from a heat block which is contacted to said first object so as to form a molten portion;

soldering said first conductive part to said second conductive part by supporting said first object by said heat block to contact said first object with said second object via said molten portion;

wherein the method further comprises the step of controlling a shape of said molten portion by adjusting the distance between said first conductive part and said second conductive part under melting conditions of said molten portion during soldering.

3. The method of claim 2, wherein said first object is a semiconductor chip.

4. The method of claim 2, wherein said first conductive part is a solder bump.

5. The method of claim 2, wherein said second object is a mounting board.

6. Method of claim 2 wherein a second heat source block contacts said second object.

7. The method of claim 2, wherein said first object is a BGA module.

8. Method of claim 2 wherein said heat source block contacts said first object back.

9. The method of claim 8, further comprising the step of separating said heat source block from said first object after soldering to control and cool the temperature of said soldered first and second conductive parts by radiant heat from said heat source block to said first object during said separating.

10. The method of claim 2, wherein the step of soldering is performed using heat conduction from said heat source block to said first conductive part and heat radiation between said first conductive part and said second conductive part.

11. The method of claim 10, wherein said first conductive part comprises two materials, one of which having a higher melting point than the other of the two materials.

12. The method of claim 10, wherein said first conductive part comprises gold.

13. The method of claim 10, further comprising a solder layer formed on and contacting said second conductive part.

* * * * *